(12) United States Patent
Takayama et al.

(10) Patent No.: US 7,045,861 B2
(45) Date of Patent: May 16, 2006

(54) LIGHT-EMITTING DEVICE, LIQUID-CRYSTAL DISPLAY DEVICE AND METHOD FOR MANUFACTURING SAME

(75) Inventors: Toru Takayama, Kanagawa (JP); Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/394,005

(22) Filed: Mar. 24, 2003

(65) Prior Publication Data

US 2003/0193056 A1    Oct. 16, 2003

(30) Foreign Application Priority Data

Mar. 26, 2002    (JP)    .............................. 2002-087222

(51) Int. Cl.
*H01L 27/12*    (2006.01)
(52) U.S. Cl. ........................... 257/347; 257/59; 257/72
(58) Field of Classification Search ................ 257/347, 257/752, 59, 72
See application file for complete search history.

(56) References Cited

U.S. PATENT DOCUMENTS

| | | | |
|---|---|---|---|
| 5,798,297 A * | 8/1998 | Winnerl et al. ............. | 438/622 |
| 5,998,805 A * | 12/1999 | Shi et al. ....................... | 257/40 |
| 6,147,408 A | 11/2000 | Ogure et al. | |
| 6,204,520 B1 * | 3/2001 | Ha et al. ........................ | 257/72 |
| 6,275,275 B1 | 8/2001 | Ha | |
| 6,440,784 B1 * | 8/2002 | Lee .............................. | 438/161 |
| 6,734,049 B1 * | 5/2004 | Yoo et al. ..................... | 438/151 |
| 6,900,464 B1 * | 5/2005 | Doi et al. ....................... | 257/72 |
| 2003/0020065 A1 | 1/2003 | Honda | |

FOREIGN PATENT DOCUMENTS

| | | |
|---|---|---|
| JP | 11-97441 | 4/1999 |
| JP | 2002-202734 | 7/2002 |

OTHER PUBLICATIONS

Lu, M et al., "*Amorphous Silicon TFT Active-Matrix Oled Pixel*", Lasers and Electro-Optics Society Annual Meeting, 1998, pp. 130-131, Dec. 1, 1998.
"*TFT/LCD Damascene Scan Lines*", IBM Technical Disclosure Bulletin., vol. 32/No. 3B/ pp. 67-68, Aug. 1, 1989.
European Search Report Dated Jul. 22, 2003.

* cited by examiner

*Primary Examiner*—Sara Crane
(74) *Attorney, Agent, or Firm*—Jeffrey L. Costellia; NixonPeabody, LLP

(57) ABSTRACT

The present invention provides a structure of a semiconductor device that realizes low power consumption even where increased in screen size, and a method for manufacturing the same. The invention forms an insulating layer, forms a buried interconnection (of Cu, Au, Ag, Ni, Cr, Pd, Rh, Sn, Pb or an alloy thereof) in the insulating layer. Furthermore, after planarizing the surface of the insulating layer, a metal protection film (Ti, TiN, Ta, TaN or the like) is formed in an exposed part. By using the buried interconnection in part of various lines (gate line, source line, power supply line, common line and the like) for a light-emitting device or liquid-crystal display device, line resistance is decreased.

15 Claims, 14 Drawing Sheets

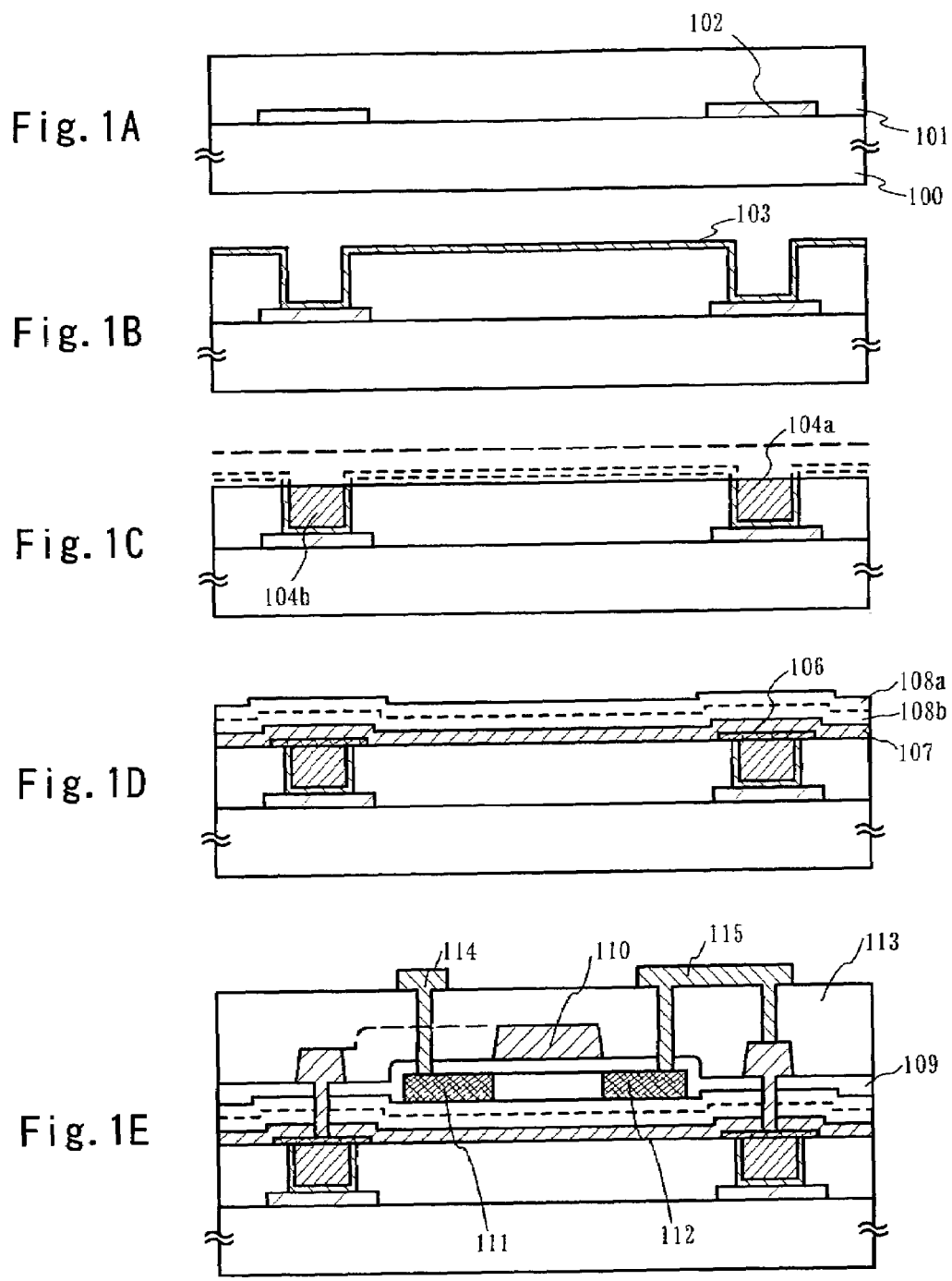

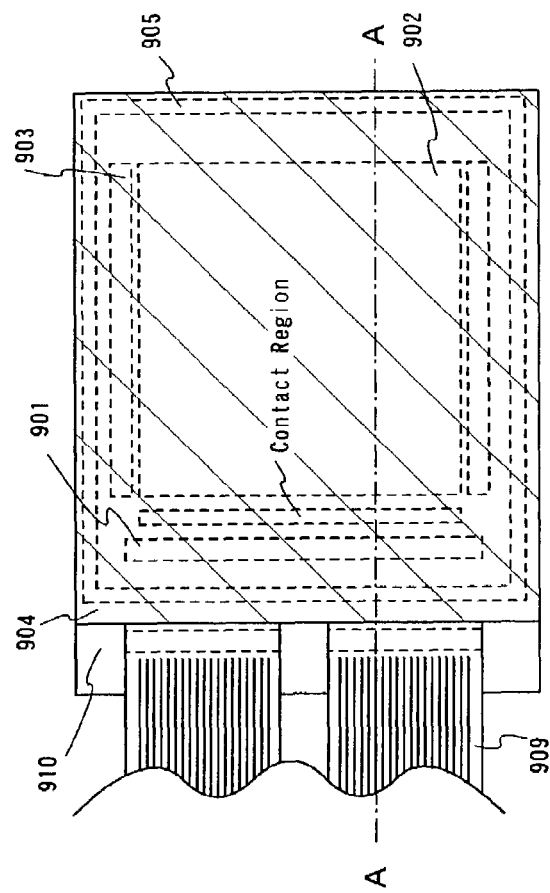
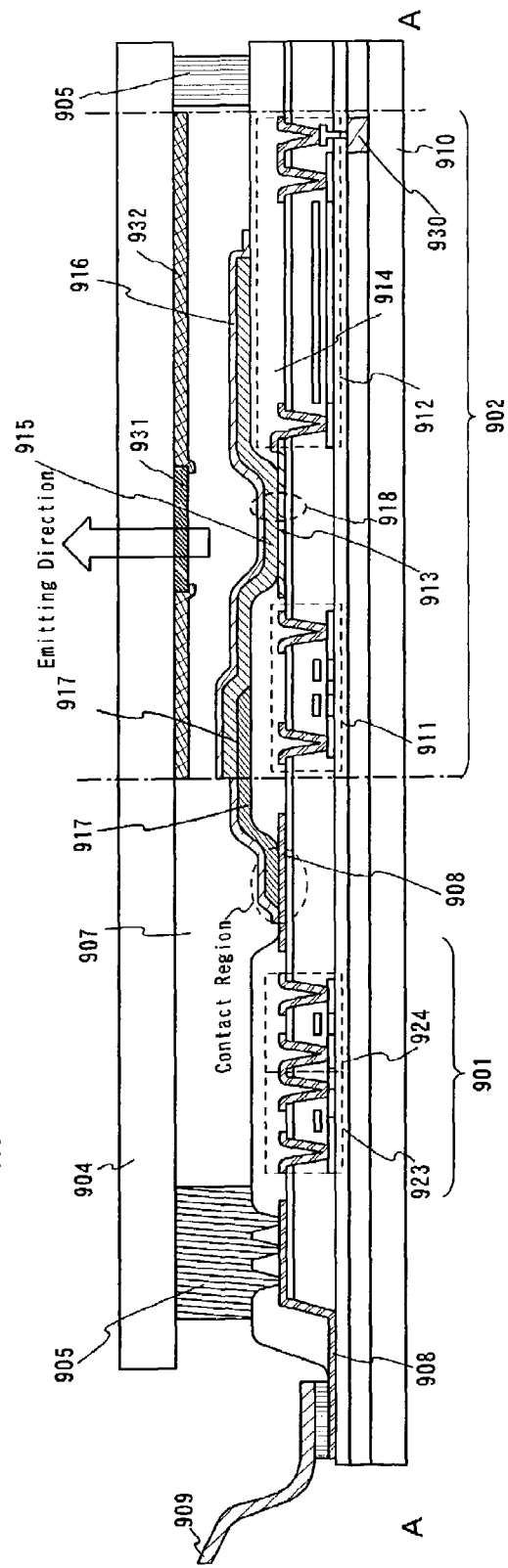
Fig. 11A
Fig. 11B

LIGHT-EMITTING DEVICE, LIQUID-CRYSTAL DISPLAY DEVICE AND METHOD FOR MANUFACTURING SAME

BACKGROUND OF THE INVENTION

1. Technical Field of the Invention

The present invention relates to a semiconductor device having a circuit configured with thin-film transistors (hereinafter, referred to as TFTs) and a method for manufacturing same. For example, the invention relates to an electronic apparatus mounting, as a part, an electro-optical device represented by a liquid-crystal display or a light-emitting device having OLEDs.

Incidentally, the semiconductor device in this description refers to a device as a whole which is capable of functioning by the utilization of a semiconductor characteristic, i.e. electro-optical devices, semiconductor circuits and electronic apparatuses are all fallen under semiconductor devices.

2. Description of the Related Art

Recently, attentions are drawn to the art to structure a thin-film transistor (TFT) by the use of a semiconductor film (thickness: approximately several to several hundred nm) formed over a substrate having an insulating surface. Thin-film transistors are broadly used on electronic devices, such as ICs and electro-optical devices. Particularly, development is hurried up for a switching element for an image display device.

Conventionally, the liquid-crystal display is known as an image display device. There is a tendency of frequent use of the liquid-crystal display of the active-matrix type because of the capability of obtaining an image with definition as compared to the passive-type liquid-crystal display devices. In the active-matrix liquid-crystal display device, a display pattern is formed on the screen by driving the pixel electrodes arranged in a matrix form. Specifically, by applying a voltage to between a selected pixel electrode and a counter electrode corresponding to that electrode, optical modulation is done in the liquid-crystal layer arranged between the pixel electrode and the counter electrode. The optical modulation is recognized as a display pattern by the observer.

Meanwhile, for the light-emitting devices using OLEDs, TFTs are requisite elements in realizing active-matrix drive scheme. Consequently, the light-emitting device using OLEDs has, on each pixel, at least a TFT functioning as a switching element and a TFT supplying current to the OLED. Light-emitting elements using an organic compound as phosphors, featured in small thickness, light weight, high responsibility, direct-current low voltage drive, are expected for the application to the next-generation display panel. In particular, the display device arranging the light-emitting elements in a matrix form is considered excellent in respect of its wide viewing angle and hence higher visibility as compared to the conventional liquid-crystal display device.

The luminescent mechanism of a light-emitting element is considered as follows. That is, by applying a voltage to a pair of electrodes sandwiching an organic compound layer, the electrons injected at the cathode and the holes injected at the anode are recombined at luminous centers in the organic compound layer. The molecular exciter, upon returning to the ground state, gives off energy causing light emission. The excitation state is known as singlet excitation and triplet excitation. Electro-luminescence is considered possible through any of the excitation states.

For the light-emitting device formed by such light-emitting elements arranged in a matrix form, it is possible to use drive schemes of passive-matrix drive (simple matrix type) and active-matrix drive (active-matrix type). However, in the case with increased pixel density, the active-matrix type having a switch on each pixel (or one dot) is considered advantageous because of the capability of driving at low voltage.

There are increasing applications of such active-matrix type display devices (representatively, liquid-crystal and light-emitting display devices). With the increasing area in screen size, there are increasing requirements for improving definition, opening ratio and reliability. At the same time, requirements are toward production increase and cost reduction.

Conventionally, where TFTs are fabricated by using aluminum as a TFT gate interconnection material, there encounter projections, such as hillocks or whiskers, formed by thermal process or TFT poor operation or TFT characteristic reduction due to the diffusion of aluminum atoms into the channel region. To cope with this, in the case of using a metal material resistive to the thermal process, representatively high melt-point metal element, the problem arises that interconnection resistance increases or so with increase in screen area size, incurring increased power consumption.

Accordingly, it is a problem of the present invention to provide a structure of a semiconductor device that realizes low power consumption even where increased in screen size, and a method for manufacturing the same.

SUMMARY OF THE INVENTION

In order to solve the problem, the present invention forms an insulating layer, forms a buried interconnection (of Cu, Au, Ag, Ni, Cr, Pd, Rh, Sn, Pb or an alloy thereof) in the insulating layer. Furthermore, after planarizing the surface of the insulating layer, a metal protection film (Ti, TiN, Ta, TaN or the like) is formed in an exposed part. By using the buried interconnection as part of various lines (gate line, source line, power supply line, common line and the like) of light-emitting devices and liquid-crystal display device, line resistance is decreased. The present invention can realize low power consumption even in case screen size is increased in area.

The structure of the invention disclosed in this description is, as exemplified in FIGS. 1A–1E, a light-emitting device comprising, between a first substrate having an insulating surface and a second substrate having light transmission property:

a pixel region having a plurality of light-emitting elements, the light emitting element having a first electrode, a layer containing organic compound provided on and in contact with the first electrode, and a second electrode provided on and in contact with the layer containing organic compound; and a drive circuit having thin-film transistors;

whereby the pixel region is arranged with a gate line, source line or power supply line made with a buried interconnection.

In the structure, the buried interconnection is of copper, silver, gold or an alloy thereof which is to be plating-processed. Also, the buried interconnection is provided in a layer lower than the thin-film transistor.

Also, in the structure, the layer containing organic compound is a material for white light emission and combined with a color filter provided on the second substrate. Otherwise, the layer containing organic compound is a material for single-color light emission and combined with a color change layer or coloring layer provided on the second substrate.

Also, the structure of the invention for realizing the construction is a method for manufacturing a light-emitting device comprising:

a first step of forming an etching-stop layer having an electric conductivity on an insulating surface;

a second step of forming a first insulating film covering the etching-stop layer;

a third step of etching the first insulating film to open an opening reaching the etching-stop layer;

a fourth step of forming a seed and carrying out plating to form a buried interconnection covering the opening;

a fifth step of carrying out planarization;

a sixth step of forming a second insulating film containing aluminum;

a seventh step of forming a third insulating film on the second insulating film;

an eighth step of forming a semiconductor layer on the third insulating film;

a ninth step of forming a fourth insulating film on the semiconductor layer;

a tenth step of forming a gate electrode on the fourth insulating film;

an eleventh step of forming a line connecting to the semiconductor layer and a line connecting the buried interconnection;

a twelve step of forming a first electrode; and a thirteenth step of forming a layer containing organic compound on the first electrode and a second electrode on the layer containing organic compound.

Also, in the structure concerning the manufacturing method, the buried interconnection is a power supply line.

Also, in the structure concerning the manufacturing method, the buried interconnection is of copper, silver, gold or an alloy thereof.

Also, the structure of another invention is, as shown in FIG. 12, a liquid-crystal display device comprising, between a first substrate having an insulating surface and a second substrate having light transmission property:

a pixel region having a first electrode, a second electrode and a liquid-crystal material sandwiched between the electrodes; and a drive circuit having thin-film transistors;

whereby the pixel region is arranged with a gate line or source line made by a buried interconnection.

Also, in the structure, the buried interconnection is of copper, silver, gold or an alloy thereof. Also, in the structure, the buried interconnection is provided in a layer lower than the thin-film transistor.

Also, the structure of the invention for realizing the construction is a method for manufacturing a liquid-crystal display device comprising:

a first step of forming an etching-stop layer having an electric conductivity on an insulating surface;

a second step of forming a first insulating film covering the etching-stop layer;

a third step of etching the first insulating film to open an opening reaching the etching-stop layer;

a fourth step of forming a seed and carrying out plating to form a buried interconnection covering the opening;

a fifth step of carrying out planarization;

a sixth step of forming a second insulating film containing aluminum;

a seventh step of forming a third insulating film on the second insulating film;

an eighth step of forming a semiconductor layer on the third insulating film;

a ninth step of forming a fourth insulating film on the semiconductor layer;

a tenth step of forming a gate electrode on the fourth insulating film;

an eleventh step of forming a source line connected to the semiconductor layer and a line connecting between the buried interconnection and the gate line.

Also, in the structure concerning the manufacturing method, the buried interconnection is a gate line. Also, in the structure concerning the manufacturing method, the buried interconnection is of copper, silver, gold or an alloy thereof.

Also, plating may be done using the etching-stop layer as a seed.

Incidentally, the light-emitting element (EL element) has a layer containing an organic compound to obtain electroluminescence caused by applying an electric field (hereinafter, described as EL layer), an anode and a cathode. The electro-luminescence in an organic compound includes luminescence of upon returning from a singlet excitation state to the ground state (fluorescence) and luminescence of upon returning from a triplet excitation state to the ground state (phosphorescence). The light-emitting device fabricated by the invention is applicable for the case using any of luminescence.

The layer containing organic compound is in a lamination structure. Typically, included is a lamination structure having a hole transport layer/light-emitting layer/electron transport layer on the anode. This structure has an extremely high light-emission efficiency. Almost all the light-emitting devices currently researched and developed adopt this structure. Besides, the structure may be a lamination of pole injection layer/hole transport layer/electron transport layer or hole injection layer/hole transport layer/light-emitting layer/light-emitting layer/electron transport layer/electron injection layer in the order. The light-emitting layer may be doped with a fluorescent pigment or the like. These layers may all be formed by using low-molecular materials or all be formed by using high-molecular materials. Incidentally, in the description, all the layers provided between the cathode and the anode are collectively referred to as a layer containing organic compound (EL layer). Accordingly, the hole injection layer, the hole transport layer, the light-emitting layer, the electron transport layer and the electron injection layer are all included in the EL layer. Also, the layer containing organic compound (EL layer) may contain an inorganic material such as silicon.

Meanwhile, in the light-emitting device of the invention, there is no limitation in drive method for screen display, i.e. dot-sequence drive method, line-sequence drive method or plane-sequence drive method may be used. Typically, line-sequence drive method may be used, and time-division tone drive method or area-tone drive method be properly employed. Also, the video signal to be input to the source line of the light-emitting device may be an analog signal or digital signal. The drive circuit or the like may be properly designed matched to the video signal.

BRIEF DESCRIPTION OF THE DRAWINGS

FIGS. 1A to 1E are sectional views each showing a process of the present invention (embodiment);

FIGS. 11A and 11B are a sectional view and top view of an active-type display device (example 1);

DESCRIPTION OF THE PREFERRED EMBODIMENTS

Figure 2A:
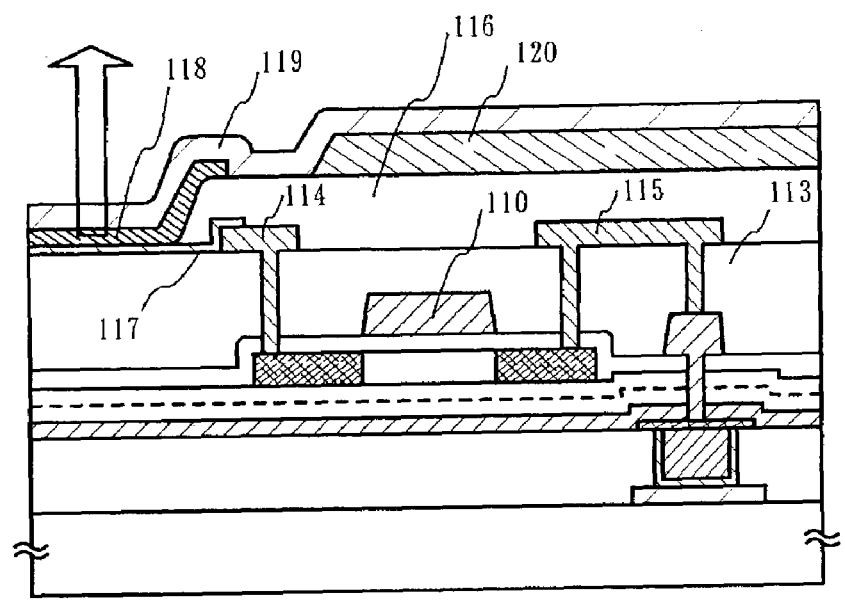
FIGS. 2A and 2B are views each showing a section of a light-emitting element of the invention (example 1)

Embodiments of the present invention will now be explained.

Herein, in FIGS. 1A–1E are shown an example to form a buried interconnection and TFT.

First, an etching-stop layer 102 is formed on a substrate 100 having an insulating surface. The etching-stop layer 102 may use a film, or a lamination thereof, based on an element selected from Ni, Ti, W, WSi$_x$, Al, Mo, Ta, Cr or Mo, or an alloy or compound material based on the element or elements. The etching-stop layer 102 is to serve as a seed layer (cathode in a plating process) in an electrolytic plating process to be carried out later. Subsequently, an insulating film 101 is formed based on silicon to cover the etching-stop layer 102. (FIG. 1A)

Then, patterning is made to selectively etch the insulating film 101 thereby forming an opening (trench) reaching the etching-stop layer 102. After forming a first barrier layer 103, an electrolytic plating process is carried out to form a low-resistance metal film having a sufficient thickness in the opening (trench). The electrolytic plating process is a method to flow a direct current in a solution containing the ions of a metal to be formed by the plating process thereby forming a metal film on a cathode surface. The plating metal can use a material having a low electric resistance, e.g. copper, silver, gold, chromium, iron, nickel, platinum or an alloy of these. The film thickness of a metal film to be formed in an electrolytic plating process can be properly set with controlling a current density and time by a practitioner. Because copper has an extremely low electric resistance, shown herein is an example using copper (Cu) that electrolytic plating is possible in forming a low resistance metal film. Prior to plating, a seed is preferably formed. Meanwhile, the first barrier layer 103 is a diffusion preventing layer against copper having a fast diffusion rate in an insulating film based on silicon oxide, i.e. a barrier metal, preferably using a metal material (WN$_x$, TaN$_x$, TiSi$_x$N$_y$, WSi$_x$N$_y$, TaSi$_x$N$_y$, or the like) having a specific resistance value of 300–500 μΩcm or less. Meanwhile, because copper has a poor adhesion to an insulating film based on silicon oxide, it is useful to form a first barrier layer 103 having a good adhesion.

Then, a planarizing process is carried out, which is represented by the chemical mechanical polish process (hereinafter, referred to as CMP process). Due to this, the copper and first barrier layer is left only in the opening (trench). Unwanted parts are removed away, thereby forming a buried-type interconnection (hereinafter, referred to as buried interconnection) 104a, 104b (FIG. 1B).

In order to enhance the oxidation resistance of an exposed part of copper, a second barrier layer 106 is formed. The second barrier layer 106 is useful as a diffusion preventing layer against copper having a fast diffusion rate in an insulating film based on silicon oxide, and preferably uses silicon nitride or a metal material (TiN, NbN, WN$_x$, TaN$_x$, TiSi$_x$N$_y$, WSi$_x$N$_y$, TaSi$_x$N$_y$, or the like). Meanwhile, because copper has a poor adhesion to an insulating film based on silicon oxide, it is useful to form a second barrier layer 106 having a good adhesion.

Subsequently, a layer 107 expressed by AlN$_x$O$_y$ is formed as an underlying insulating film for prevention against impurity diffusion into a TFT to be formed later. The layer 107 expressed by AlN$_x$O$_y$ may be deposited by an RF sputter technique using a target of AlN or Al with oxygen, nitrogen or inert gas introduced from the foregoing gas introducing system. Nitrogen may be contained in a range of several atm % or more, preferably 2.5 atm %–47.5 atm %, in the layer expressed by AlN$_x$O$_y$. Oxygen may be 47.5 atm % or less, preferably 0.01–20 atm % or less.

Then, an underlying insulating film 108 is formed by a lamination of insulating films such as a silicon oxide film, a silicon nitride film or a silicon oxynitride film. Although the underlying insulating film 108 herein uses a two-layer structure, it may use a structure having a single layer or a two layers or more of the insulating films. The first layer 108a of the underlying insulating film is a silicon oxide nitride film deposited to 10–200 nm (preferably 50–100 nm) by a plasma CVD process using a reaction gas of SiH$_4$, NH$_3$ and N$_2$O. Herein, formed is a silicon oxide nitride film (composition ratio: Si=32%, O=27%, N=24% and H=17%) having a film thickness of 50 nm. The second layer 108b of the underlying insulating film is a silicon oxide nitride film deposited to 50–200 nm (preferably 100–150 nm) by a plasma CVD process using a reaction gas of SiH$_4$ and N$_2$O. Herein, formed is a silicon oxide nitride film (composition ratio: Si=32%, O=59%, N=7% and H=2%) having a film thickness of 100 nm. (FIG. 1C)

Subsequently, a semiconductor layer is formed on the underlying film. The semiconductor layer is formed by patterning, into a desired form, a crystalline semiconductor film obtained by forming an amorphous-structured semiconductor film by known means (sputter process, LPCVD process or plasma CVD process) and carrying out a known crystallizing process (laser crystallizing process, thermal crystallizing process or thermal crystallizing process using a catalyst such as nickel). This semiconductor layer is formed in a thickness of 25–80 nm (preferably 30–60 nm). The material of the crystalline semiconductor film, although not limited in material, is preferably formed of silicon or a silicon-germanium alloy.

In the case of making a crystalline semiconductor film by a laser crystallizing process, it is possible to use an excimer laser of a pulse-oscillation or continuous-oscillation type, a YAG laser or a YVO$_4$ laser. In the case of using such a laser, preferably used is a method that the laser light emitted from a laser oscillator is focused by an optical system into a linear form to be irradiated onto the semiconductor film. The condition of crystallization is to be appropriately selected by the practitioner. In the case of using an excimer laser, pulse oscillation frequency is 30 Hz and laser energy density is 100–400 mJ/cm$^2$ (typically 200–300 mJ/cm$^2$). Meanwhile, in the case of using a YAG laser, preferably its second harmonic is used and pulse oscillation frequency is 1–10 kHz and laser energy density is 300–600 mJ/cm$^2$ (typically 350–500 mJ/cm$^2$). The laser light focused linear to a width of 100–1000 μm, e.g. 400 μm, is irradiated throughout the substrate entirety, whereupon the overlap ratio of linear laser beam may be taken 80–98%.

Then, the surface of the semiconductor layer is cleaned by an etchant containing a hydrogen fluoride, to form a gate insulating film 109 covering the semiconductor layer. The gate insulating film 109 is formed by an insulating film containing silicon having a thickness of 40–150 nm by the use of a plasma CVD process or sputter process. This embodiment forms a silicon oxide nitride film (composition ratio: Si=32%, O=59%, N=7% and H=2%) in a thickness of 115 nm by a plasma CVD process. Naturally, the gate insulating film is not limited to a silicon oxide nitride film but may be made in a single layer or a lamination of layers of insulating films containing other form of silicon.

After cleaning the surface of the gate insulating film 109, a gate electrode 110 or connection electrode is formed. Before forming a gate electrode 110, a contact hole is formed reaching the buried interconnection 104a, 104b. Thus, electric connection is provided by forming a gate electrode 110 contacted with the buried interconnection 104b or a connection electrode contacted with the buried interconnection 104a.

Then, a p-type providing impurity element (such as B), boron herein, is added in proper amount to the semiconductor, to form a source region 111 and a drain region 112. After the addition, heating process, intense light radiation or laser irradiation is made in order to activate the impurity element. Simultaneously with activation, restoration is possible from the plasma damage to the gate insulating film or from the plasma damage at the interface between the gate insulating film and the semiconductor layer. Particularly, it is extremely effective to irradiate the second harmonic of a YAG laser at a main or back surface thereby activating the impurity element in an atmosphere at room temperature to 300° C. YAG laser is preferable activating means because of less maintenance.

In the subsequent process, after an interlayer insulating film 113 is formed of an organic or inorganic material and hydrogenation is made thereon, a contact hole is formed therein reaching the source region, drain region or connection electrode. Next, a source electrode (line) 115 and a drain electrode 114 are formed to complete a TFT (p-channel TFT) having a buried interconnection. (FIG. 1E) Although the example was herein shown that the buried interconnection and the drain electrode 114 are connected together through a connection electrode simultaneously formed with the gate electrode, a drain electrode may be formed after forming a contact hole reaching the buried interconnection without using a connection electrode.

Figure 2B:
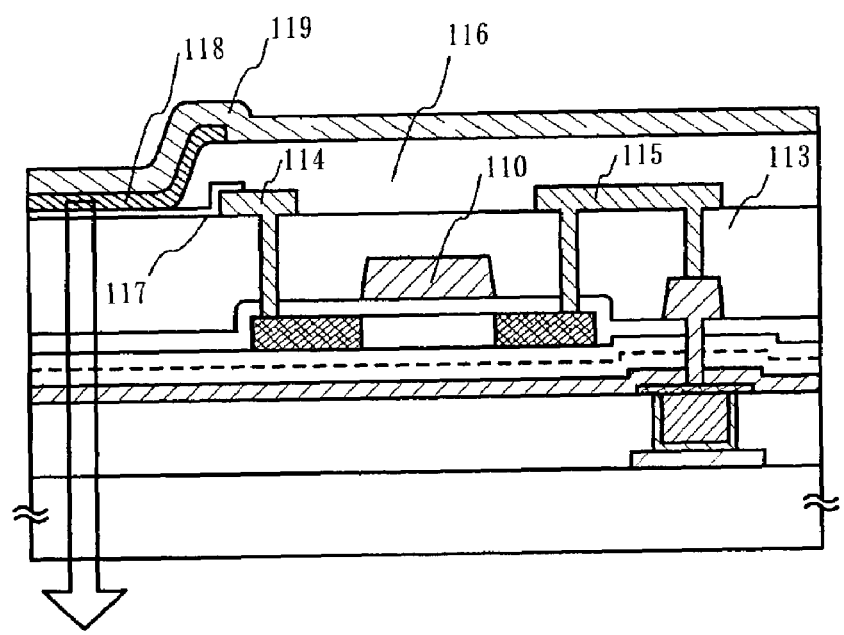
Figure 12:
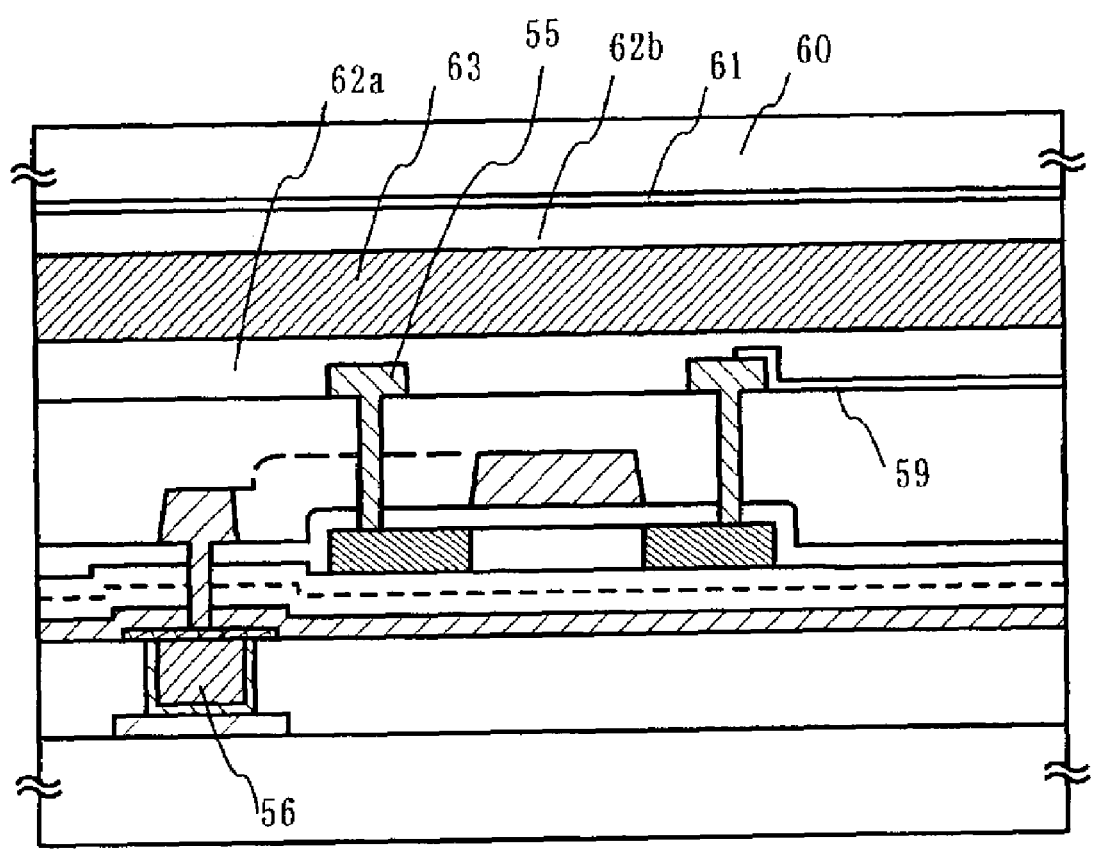
FIG. 12 is a view showing a sectional view of a liquid-crystal display device (example 2)

The TFT having a buried interconnection 104a, 104b obtained by the above process can be used on various semiconductor devices, e.g. TFTs (current-control TFT) of a light-emitting device as shown in FIGS. 2A and 2B, or pixel TFTs of a liquid-crystal display device as shown in FIG. 12.

Incidentally, although illustrated herein were the buried interconnection 104b connected to the gate electrode and the buried interconnection 104a connected to the drain electrode, the application is possible, without limitation, to various interconnections, e.g. source line, extended line, power supply line, capacitance line or the like, thereby achieving resistance reduction.

Also, the invention is not limited to the TFT structure of FIG. 1E but, if required, may be in a lightly doped drain (LDD) structure having an LDD region between the channel region and the drain region (or source region). This structure is provided with a region an impurity element is added with light concentration at between the channel region and the source or drain region formed by adding an impurity element with high concentration, which region is called an LDD region. Furthermore, it may be in, what is called, a GOLD (Gate-drain Overlapped LDD) structure arranging an LDD region overlapped with a gate electrode through a gate insulating film.

Meanwhile, although explanation herein was by using the p-channel TFT, it is needless to say that a p-channel TFT can be formed by using an n-type impurity element (P, As, etc.) in place of the p-type impurity element.

Also, although explanation herein was on a top-gate TFT, the invention is applicable regardless of the TFr structure, e.g. the invention is applicable to a bottom-gate TFT or a forward stagger TFT.

The invention configured above will be explained with greater detail by the following embodiment.

EXAMPLE

Example 1

This example shows that the major part of the power supply line of a light-emitting device is made as a buried interconnection, in FIGS. 3 to 6.

Figure 3:
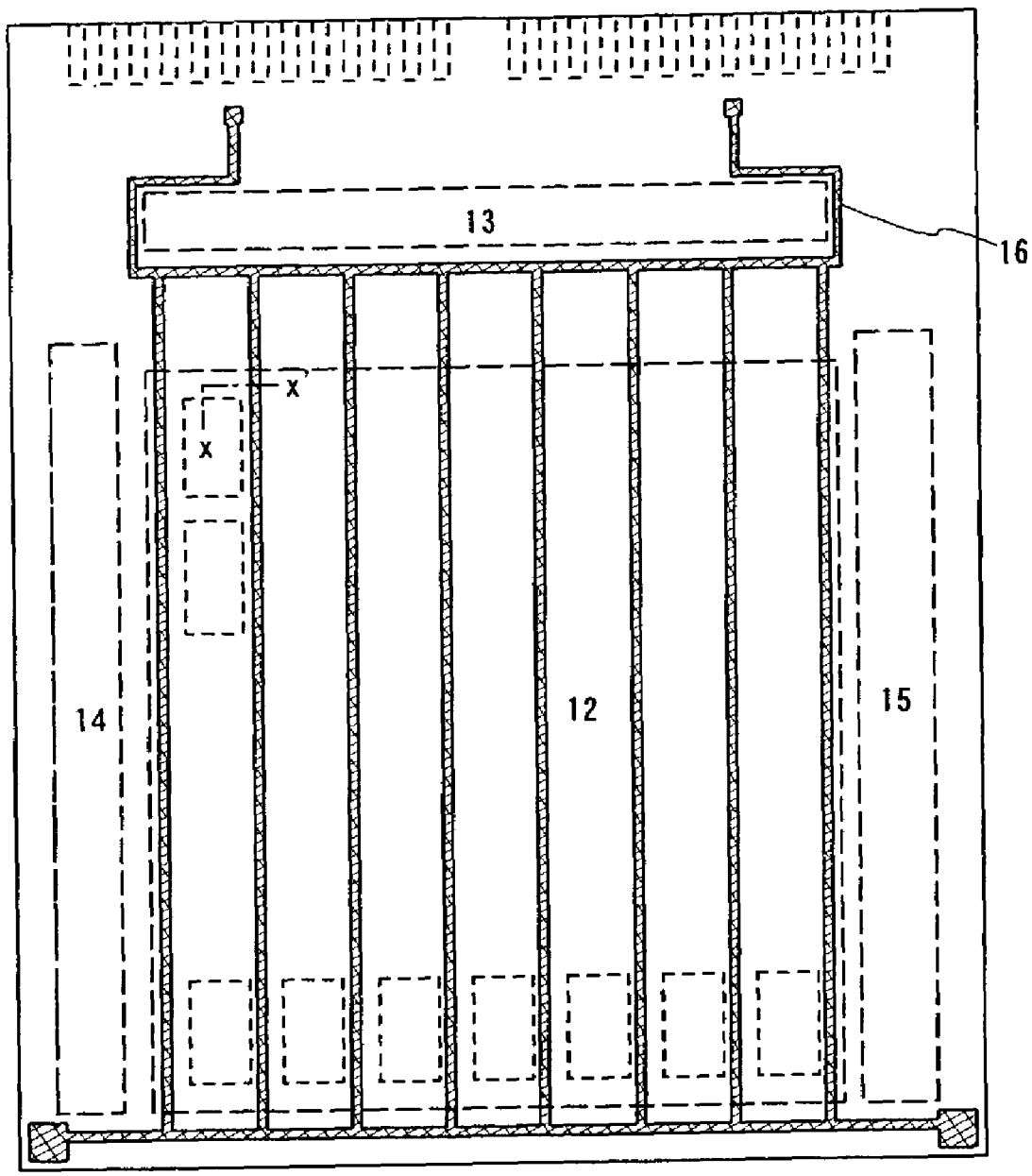
FIG. 3 is a top view in a manufacturing process of a light-emitting device (example 1)

At first, according to the above embodiment, an etching-stop layer is formed on a substrate having an insulating surface and a silicon-based insulating film is formed covering the etching-stop layer. The insulating film is selectively etched to form an opening (trench) reaching the etching-stop layer. After forming a first barrier layer, electrolytic plating is carried out to form a low-resistance metal film having a sufficient thickness in the opening (trench). Subsequently, planarization represented by the chemical mechanical polishing (hereinafter, referred to as CMP) is made to leave the copper and first barrier layer only in the opening (trench) but remove away unwanted portions, thereby forming an interconnection in a buried form. The top view in this process stage is shown in FIG. 3, wherein the sectional view taken along the dotted line x-x' therein corresponds to FIG. 1C. In FIG. 3, 12 is a pixel region, 13 is a source drive circuit, and 14, 15 show regions arranging gate drive circuits. As shown in FIG. 3, the power supply line 16 has, at its end, a connection electrode pad provided in a corner of the substrate to flow a current from an external power source when carrying out electrolytic plating. Incidentally, because this example is made in an example having single-color light-emitting elements arranged in a matrix form, the pattern is connected such that the power source line 16 is common between the pixels to make them at the same potential.

Incidentally, the power source line 16 is shown only eight in the number for simplification sake. In the case there are pixels in the number of m×n (m rows by n columns), the power supply line is actually given m in the number or the number added with one or two spare lines for enhancing the evenness in electrolytic plating.

Then, a second barrier layer is formed in order to provide an exposed portion of copper with enhanced resistance to oxidation. Furthermore, after forming a layer represented by $AlN_xO_y$ as an underlying insulating film, an underlying insulating film is formed by a lamination of insulating films such as a silicon oxide film, a silicon nitride film or a silicon oxide nitride film. Then, a crystalline semiconductor film is patterned to a desired form to form a semiconductor layer, followed by forming a gate insulating film covering the semiconductor layer.

Figure 4:
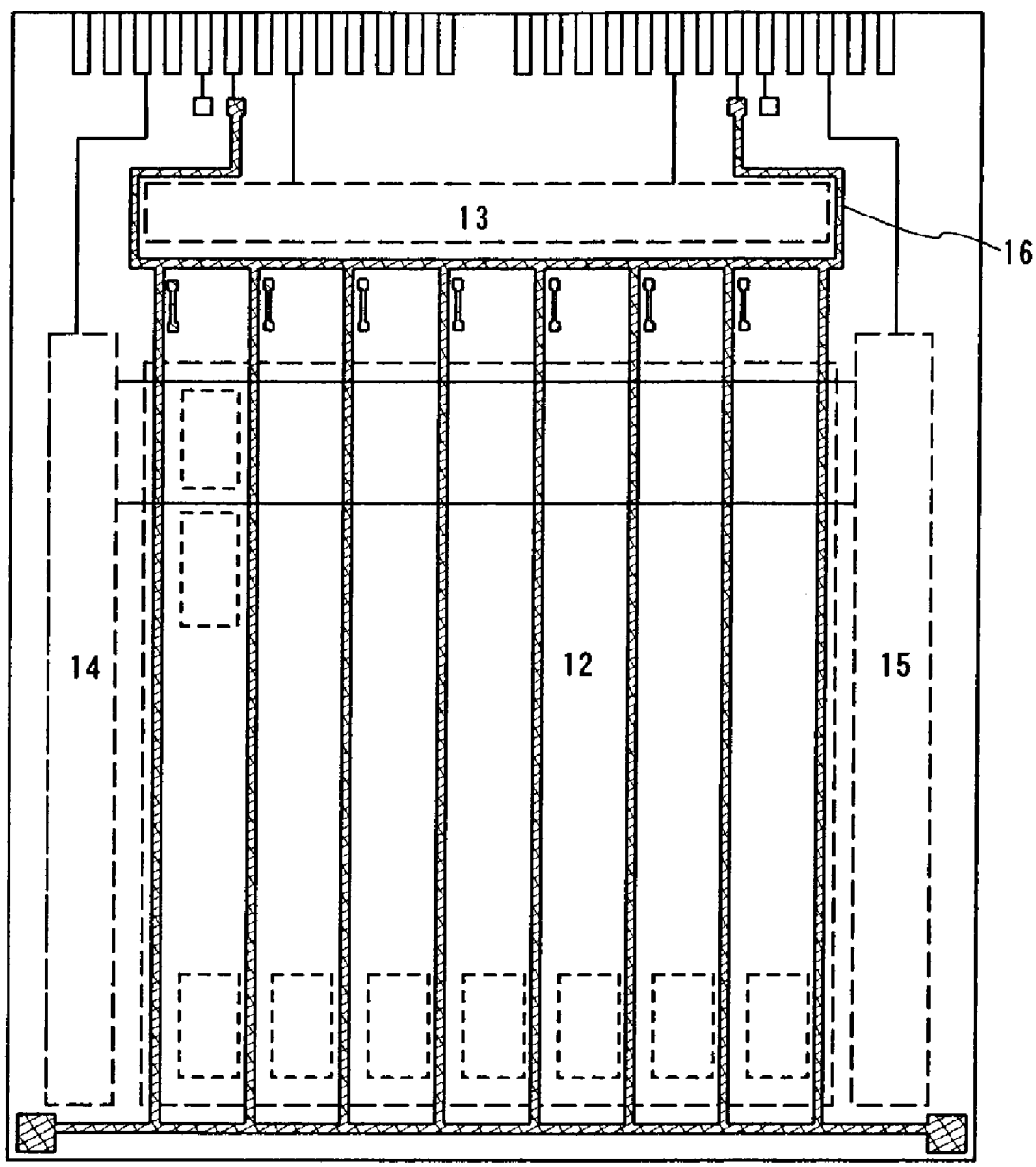
FIG. 4 is a top view in a manufacturing process of a light-emitting device (example 1)

After forming a contact hole reaching the buried interconnection, a gate line, a terminal electrode and an extended electrode are formed on the gate insulating film. The extended electrode, provided between the source drive circuit 13 and the pixel region 12, is an electrode arranged such that a source line formed later is not overlapped with the extended line (line connected to a cathode or anode of the light-emitting element) 17. Meanwhile, terminal electrodes are provided in plurality at an end of the substrate, some of which are connected to the power supply line as buried interconnection. The top view in this process stage is shown in FIG. 4.

Then, the semiconductor is properly added by a p-type providing impurity element (B or the like) or n-type providing impurity element (P, As or the like), to form source and drain regions. Subsequently, in order to activate the added impurity element, heating process, intense light radiation or laser irradiation is carried out. Then, after an interlayer insulating film is formed and hydrogenation is made, contact holes are formed reaching the source region, the drain region, the extended electrode, the terminal electrode or the buried interconnection.

Figure 5:
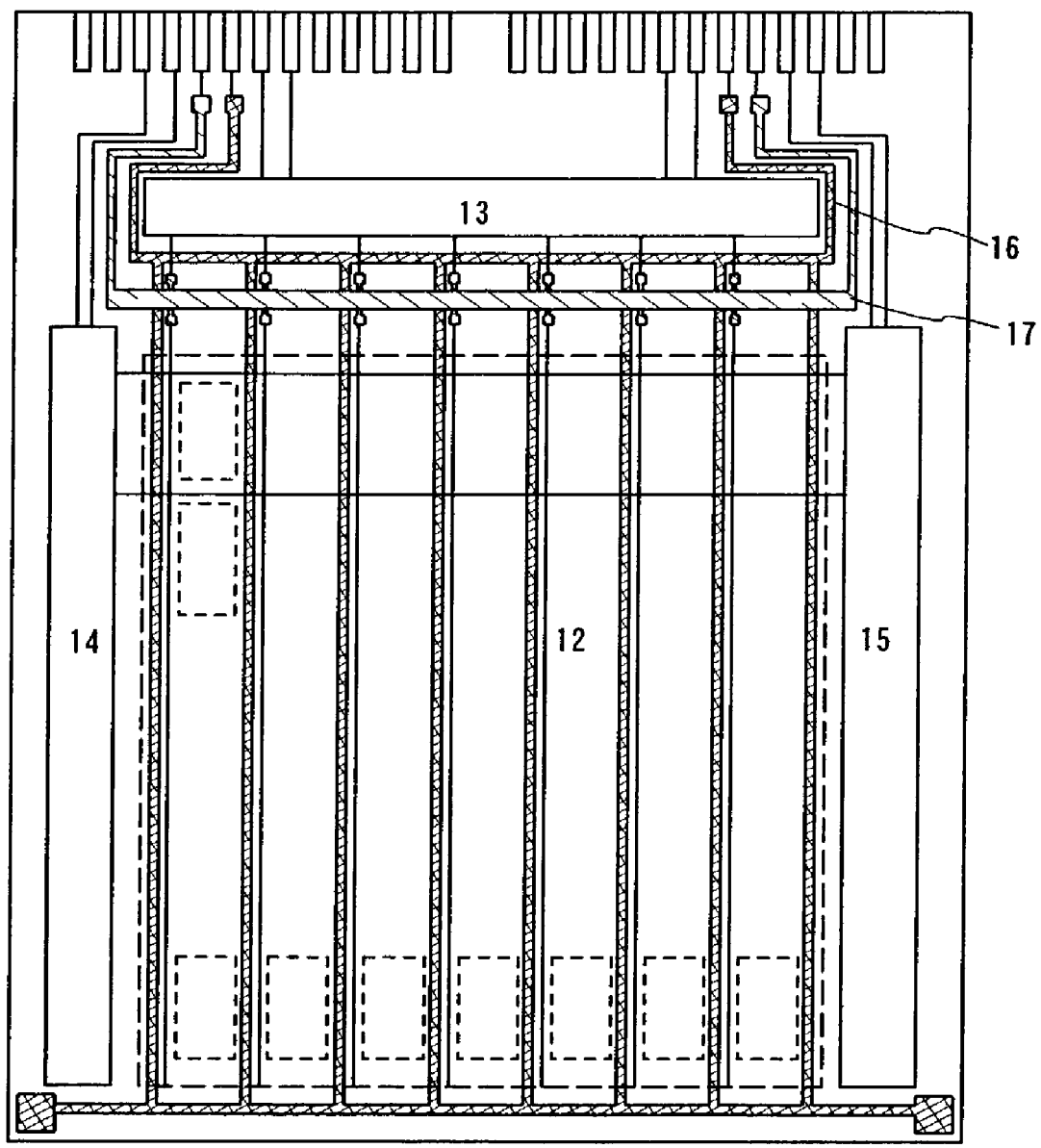
FIG. 5 is a top view in a manufacturing process of a light-emitting device (example 1)

Subsequently, source electrodes (lines), drain electrodes or connection electrodes are formed to complete various TFTs. In the stage completing the above process, in the pixel region 12, the source region and the power supply line are electrically connected to form a connection electrode contacted with the drain region (not shown herein). Meanwhile, in the drive circuit, formed are a source electrode (line) contacted to the source region and a drain electrode contacted to the drain region. Also, in the terminal region, formed are a source line connected to a certain terminal electrode and an extended line (line connected to a cathode or anode of a light-emitting element) 17 connected to another terminal electrode. Also, between the drive circuit and the pixel region is formed an extended line (line connected to a cathode or anode of a light-emitting element) 17. The top view in this process stage is shown in FIG. 5.

Then, in the pixel region, the first electrodes 19 are arranged in a matrix form that are connected to the connection electrode contacted to the drain regions. The first electrodes 19 are made into anodes or cathodes of light-emitting elements. Next, formed is an insulator (called bank, partition wall or barrier wall) covering the end of the first electrode 19. Next, in the pixel region, a layer 10 containing organic compound is formed, on which a second electrode 11 is formed to complete a light-emitting element. The second electrode 11 is made into a cathode or anode of the light-emitting element. Incidentally, in a region between the pixel region and the source drive circuit, the second electrode 11 is electrically connected to the extended line 17.

Figure 6:
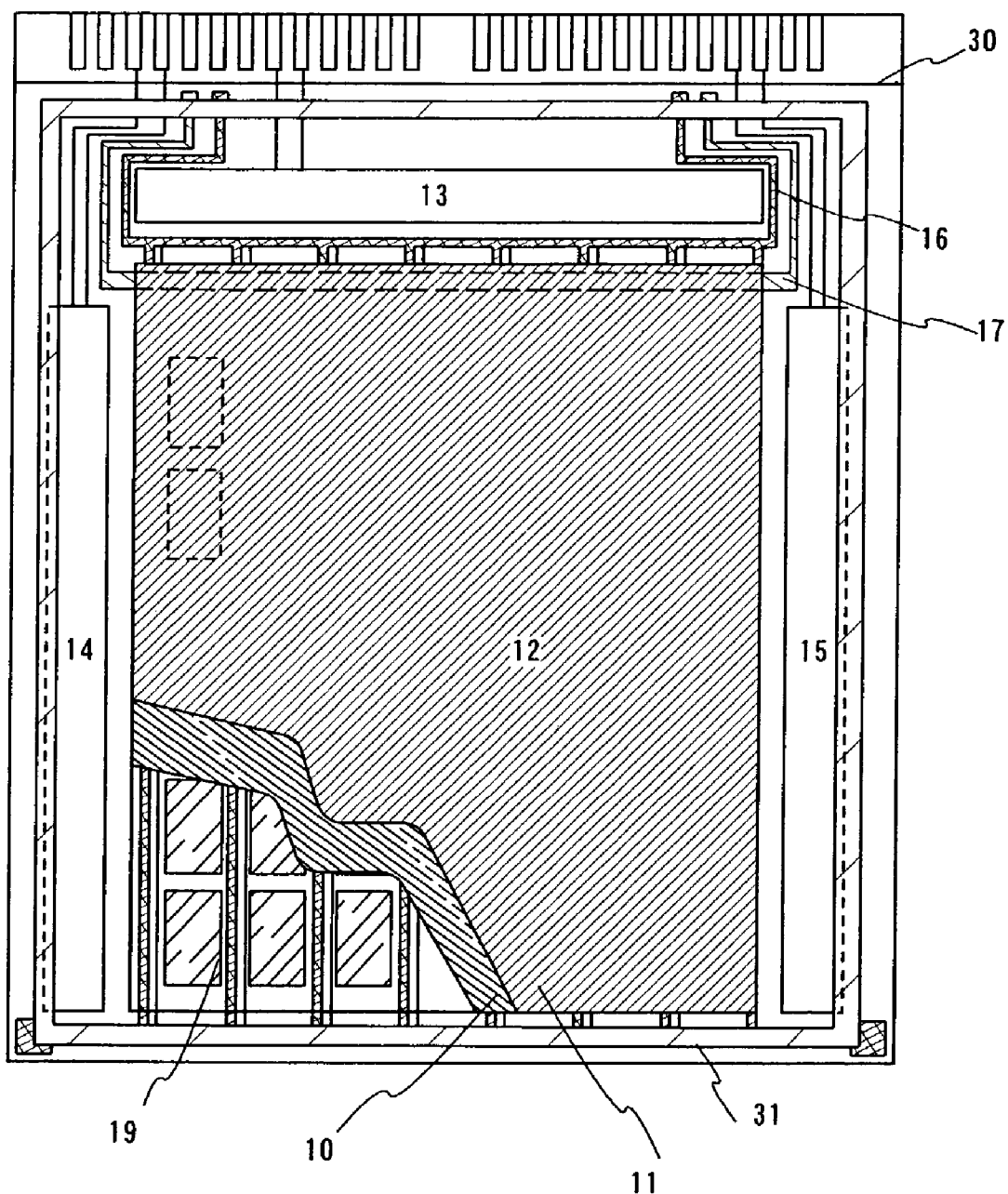
FIG. 6 is a top view in a manufacturing process of a light-emitting device (example 1)

Then, the substrate and a sealing member (light-transmissive substrate, herein) 30 are bonded together by a sealant 31. The top view in this process stage is shown in FIG. 6. Furthermore, in order to shield from the outside air, a protection film may be formed of silicon nitride, silicon oxide nitride or DLC (diamond-like carbon) on the second electrode 11. Finally, an FPC (flexible print circuit) for connection to an external circuit is bonded to the terminal electrode.

By the above process, completed is an active-matrix light-emitting device.

Incidentally, concerning the active-matrix light-emitting device having TFTs, two constructions can be considered according to the direction of light radiation. One is a structure that the light from the light-emitting element is radiated through the second electrode to the eye of an observer. In this case, the observer can recognize an image on the side of the second electrode. The other one is a structure that the light from the light-emitting element is radiated through the first electrode and substrate to the eye of an observer.

In the case of the structure that the light from the light-emitting element radiates through the second electrode to the eye of an observer as shown in FIG. 2A, it is desired to use a light-transmissive material for the second electrode 11 (electrode 119 in FIG. 2A).

For example, where the first electrode 19 (electrode 117 in FIG. 2A) is made as an anode, the material of the first electrode 19 uses a metal having a great work function (Pt, Cr, W, Ni, Zn, Sn or In). After an end region is covered by an insulator (called bank, partition wall or barrier wall) 116, a poly (ethylene dioxythiophene)/poly (styrene sulfonic acid) solution (PEDOT/PSS) is applied to the entire surface and baked. Thereafter, after a polyvinyl carbazole (PVK) solution doped with luminescent center pigment acting as a light-emitting layer (1,1,4,4-tetraphenyl-1,3-buthadiene (TPB), 4-dicyanomethylene-2-methyl-6-(p-dimethylaminostyryl)-4H-pyran (DCM1), Nilered, coumarine 6, or the like) is applied to the entire surface and baked, a cathode may be formed by a second electrode 11 (electrode 119 in FIG. 2A) having a lamination of a thin film containing a metal having a small work function (Li, Mg or Cs) and a transparent conductive film (ITO (indium oxide tin oxide alloy), indium oxide zinc oxide alloy ($In_2O_3$—ZnO), zinc oxide (ZnO) or the like) layered thereon. Incidentally, in FIG. 2A, an auxiliary electrode 120 is provided on the insulator 116, in order to reduce the resistance in the cathode. The light-emitting element thus obtained shows white light emission. Incidentally, the PEDOT/PSS, using water as solvent, is insoluble in organic solvent. Accordingly, in the case of applying PVK thereon, there is no fear of re-dissolution. Meanwhile, because solvent is different between PEDOT/PSS and PVK, it is preferred not to use the same one in the deposition chamber. Incidentally, although the example was herein shown that the layer 10 containing organic compound (118 in FIG. 2A) was formed by the application, there is no especial limitation, i.e. may be formed by a deposition process.

Figure 7:
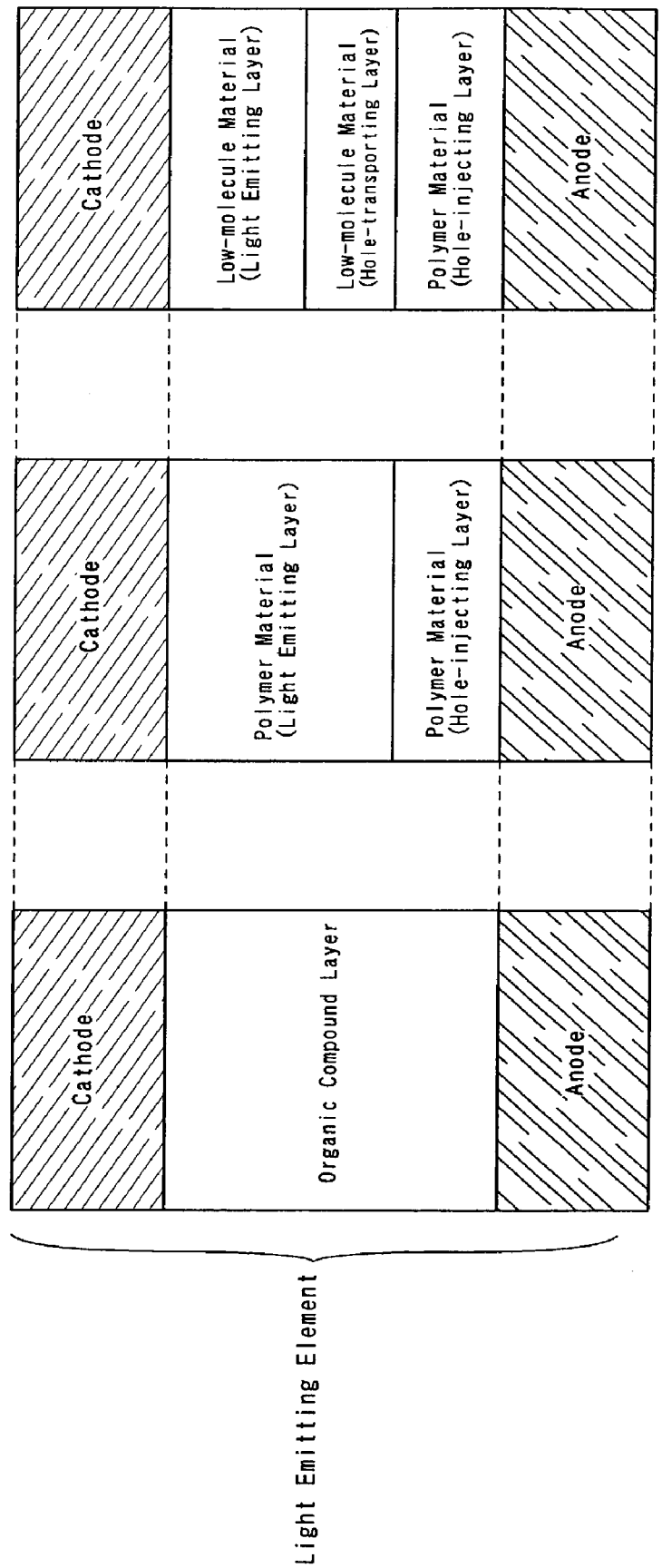
FIGS. 7A to 7C are figures each showing a lamination structure of the light-emitting element (example 1)

Meanwhile, although the above example showed the example having a lamination of organic compound as shown in FIG. 7B, the organic compound layer can be made in a single layer as shown in FIG. 7A. For example, electron-transporting 1,3,4-oxadiazole derivative (PBD) may be dispersed in hole-transporting polyvinyl carbazole (PVK). Meanwhile, 30 wt % of PBD is dispersed as electron-transport agent and four kinds of pigments (TPB, coumarin 6, DCM1, nilered) are dispersed in proper amount, thereby obtaining white light emission. Also, as shown in FIG. 7C, the organic compound layer may be provided by a lamination of a polymer material layer and a low-molecule material layer.

Incidentally, the organic compound film is formed between the anode and the cathode. By recombining between the holes injected at the anode and the electrons injected at the cathode in the organic compound film, white light emission is obtained in the organic compound film.

Also, by properly selecting and superposing, for mixing colors, an organic compound film for red light emission, an organic compound film for green light emission and an organic compound film for blue light emission, it is possible to obtain white light emission in the entirety.

Figure 8:
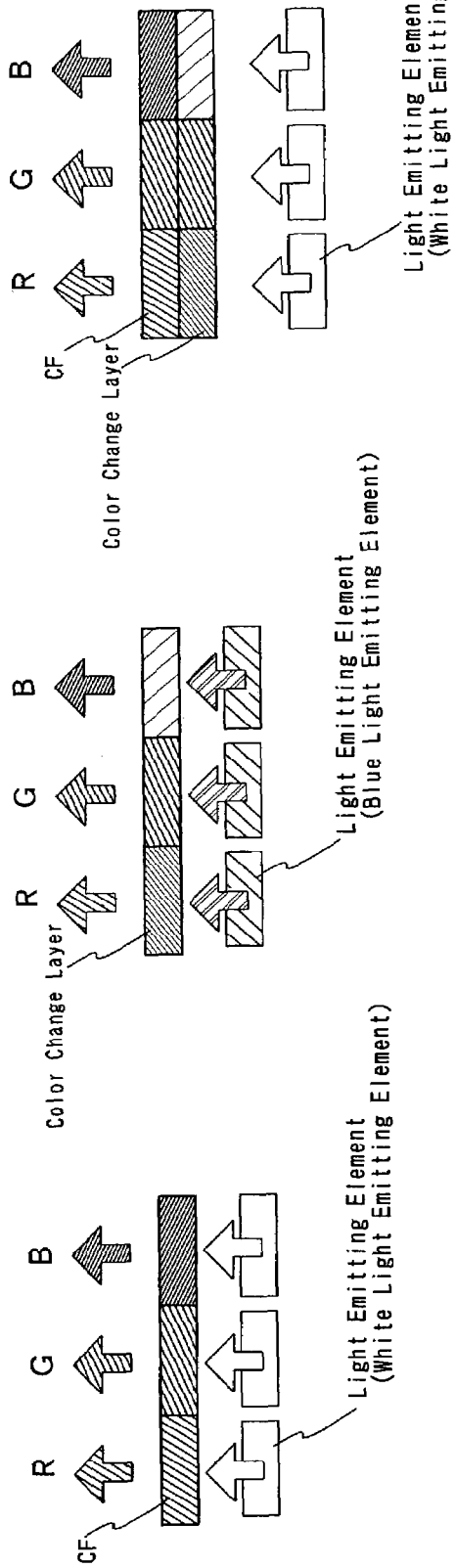
FIGS. 8A to 8C are typical figures in the case of using white emission light for full-color display (example 1)

There are various methods of full-color displaying by the use of light-emitting elements for white light. For example, as shown in FIG. 8A, there is a method of passing obtained white light emission through a color filter thereby obtaining red, green and blue light (hereinafter, referred to as color filter method).

By forming a color filter having a coloring layer (R) absorbing the portion other than red, a coloring layer (G) absorbing the portion other than green and a coloring layer (B) absorbing the portion other than blue in a direction the organic compound film emits white light, the white light from the light emitting element is separated to obtain red light, green light and blue light. Also, in the case of an active-matrix type, the TFTs are structurally formed between the substrate and the color filter. Meanwhile, the color filter has shade layer between the coloring layers. Where the screen is made great, the shade layer preferably includes desiccant.

The coloring layer (R, G, B) can use, besides a stripe pattern in the simplest form, an oblique mosaic arrangement, a triangular mosaic arrangement, an RGBG four-pixel arrangement or an RGBW four-pixel arrangement.

Figure 9:
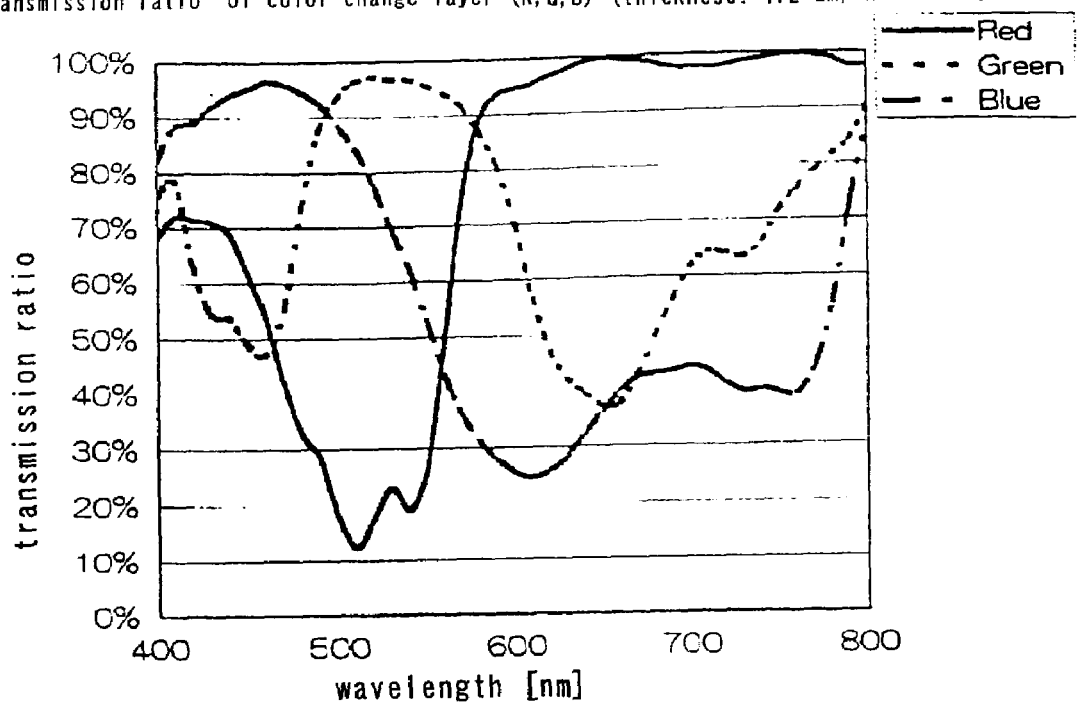
FIG. 9 is a figure showing a transmissivity of a coloring layer (example 1)
Figure 10:
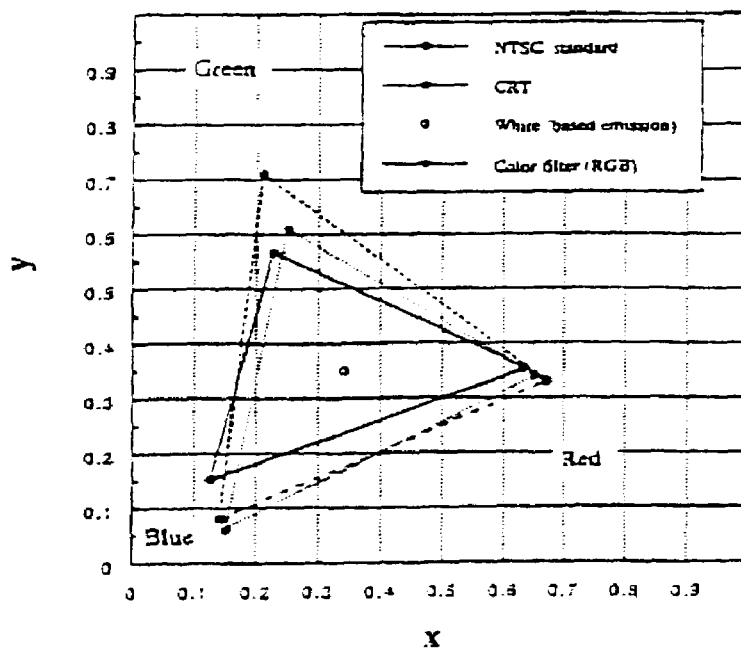
FIG. 10 is a figure showing a chromaticity coordinate (example 1)

FIG. 9 shows an example of a relationship between a transmission ratio and a wavelength on each coloring layer using white light source (D65). The coloring layer constituting the color filter is formed by using a color resist of an organic photosensitive material dispersed with a pigment. Meanwhile, FIG. 10 shows, on a chromaticity coordinate, a color reproduction range in the case of combining white emission light with a color filter. Note that the chromaticity coordinate of white emission light (x, y)=(0.34, 0.35). From FIG. 10, it can be seen that color reproduction as full colors is fully secured.

Incidentally, in this case, even if there is a difference in obtainable light color, because each is formed by the organic compound film to exhibit white emission light, there is no need to separately apply organic compound films for the emission light colors. Also, it is possible to eliminate the especial need for a circular polarization plate that prevents mirror reflection.

Now explanation is made on a CCM (color changing mediums) method to be realized by combining a blue light-emitting element having a blue-light-emitting organic compound film with a fluorescent color change layer, with reference to FIG. 8B.

In the CCM method, the fluorescent color change layer is excited by the blue light emitted from a blue light-emitting element, to carry out color change by each color change layer. Specifically, change of blue to red (B→R) is made by a color change layer, change of blue to green (B→G) is made by a color change layer and change of blue to blue (B→B) is made by a color change layer (note that the change of from blue to blue may be omitted), thereby obtaining light emission of red, green and blue. In also the CCM method, for the active matrix type, TFTs are structurally formed between the substrate and the color change layer.

Incidentally, in also this case, there is no need to form organic compound films by separate applications. Also, it is possible to eliminate the necessity of the circular polarization plate for preventing mirror reflection.

Meanwhile, where the CCM method is used, the color change layer is excited by external light because of its fluorescent nature, possibly resulting in a problem of contrast reduction. It is accordingly preferred to raise the contrast by attaching a color filter or so, as shown in FIG. 8C.

Explanation is herein made on the external appearance of the active-matrix light-emitting device overall, in FIGS. 11A and 11B. FIG. 11A is a top view showing the light-emitting device while FIG. 11B is a sectional view taken along A–A' in FIG. 11A. 901 shown by the dotted line is a source signal-line drive circuit, 902 is a pixel region, and 903 is a gate signal-line drive circuit. Also, 904 is a sealing substrate and 905 is a sealant. The interior surrounded by the sealant 905 is defined as a space 907.

908 is a line for conveying a signal to be inputted to the source signal-line drive circuit 901 and gate signal-line drive circuit 903, which receives a video signal or clock signal from an FPC (flexible print circuit) 909 serving as an external input terminal. Although only the FPC is shown, the FPC may be attached with a printed wiring board (PWB). The light-emitting device, in this description, assumably includes, besides the light-emitting device main body, a state an FPC or PWB is attached thereon.

Explanation is now made on a sectional structure, by using FIG. 11B. Although the substrate 910 is formed thereon with a drive circuit and a pixel region, the source signal-line drive circuit 901 and pixel region 902 is herein shown as a drive circuit.

The source signal-line drive circuit 901 is formed with a CMOS circuit as a combination of an n-channel TFT 923 and a p-channel TFT 924. The TFTs forming the drive circuit may be formed by a known CMOS circuit, PMOS circuit or NMOS circuit. Although this embodiment shows a driver-integrated type having a drive circuit formed on the substrate, it not necessarily required, i.e. it can be externally formed instead of on the substrate.

The pixel region 902 is formed with a plurality of pixels each of which includes a switching TFT 911, a current-control TFT 912 and a first electrode. (anode) 913 electrically connected to the drain thereof. The current-control TFT 912 has a source electrically connected with a buried interconnection 930.

Meanwhile, an insulating layer 914 is formed at both ends of the first electrode (anode) 913, while a layer 915 containing organic compound is formed on the first electrode (anode) 913. Furthermore, a second electrode (cathode) 916 is formed on the layer 915 containing organic compound. This forms a light-emitting element 918 comprising the first electrode (anode) 912, the layer 915 containing organic compound and the second electrode (cathode) 916. Because the light-emitting element 918 herein is exemplified to emit white light, there is provided a color filter formed by a coloring layer 931 and a BM 932 (overcoat layer is not shown herein for simplification sake).

The second electrode (cathode) 916 serves also as an interconnection common to all the pixels, which is electrically connected to the FPC 909 via the connection line 908. Also, a third electrode (auxiliary electrode) is formed on the insulating layer 914, thus realizing the resistance reduction in the second electrode.

The sealing substrate 904 is bonded by the sealant 905 in order to seal the light-emitting elements 918 formed on the substrate 910. A resin-film spacer may be provided in order to secure a spacing between the sealing substrate 904 and the light-emitting element 918. An inert gas, such as nitrogen, is filled in the space 907 at the inside of the sealant 905. The sealant 905 preferably uses an epoxy resin. The sealant 905 is desirably of a material less permeable of moisture or oxygen. Furthermore, a substance having an effect to absorb oxygen or moisture may be included in the space 907.

In this embodiment, the material structuring the sealing substrate 904 can use, as a material, a plastic substrate of FRP (fiberglass-reinforced plastics) PVF (polyvinyl fluoride), Mylar, polyester or acryl, besides a glass or quartz substrate. Also, after the sealing substrate 904 is bonded by using the sealant 905, it can be further sealed in a manner covering the side surface (exposed surface) by a sealant.

By sealing the light-emitting elements in the space 907 as in the above, the light-emitting elements can be completely shielded from the outside. This can prevent a substance such as oxygen or moisture that accelerates deterioration of the organic compound layer from externally intruding. Accordingly, a reliable light-emitting device can be obtained.

On the other hand, in the case of the structure that the emission light from the light-emitting element is radiated through the first electrode and substrate to the eye of an observer as shown in FIG. 2B, the first electrode 19 (electrode 117 in FIG. 2A) desirably uses a light-transmissive material.

For example, in the case that the first electrode 19 (electrode 117 in FIG. 2B) is an anode, the material of the first electrode 19 uses a transparent conductive film (ITO (indium oxide tin oxide alloy), indium oxide zinc oxide alloy ($In_2O_3$—ZnO), zinc oxide (ZnO) or the like). After covering the ends with an insulator (called bank, partition wall or barrier wall) 116, a layer 118 containing organic compound is formed, on which a second electrode 11 (electrode 119 in FIG. 2B) of a metal film (an alloy such as of MgAg, MgIn, AlLi, $CaF_2$ or CaN, or a film formed by co-deposition of an element belonging to group 1 or 2 of the periodic table with aluminum) may be formed as a cathode. When forming a cathode, a resistance heating method due to evaporation is used. Forming may be selective by the use of an evaporation mask.

This example can be freely combined with the embodiment.

Example 2

Figure 13:
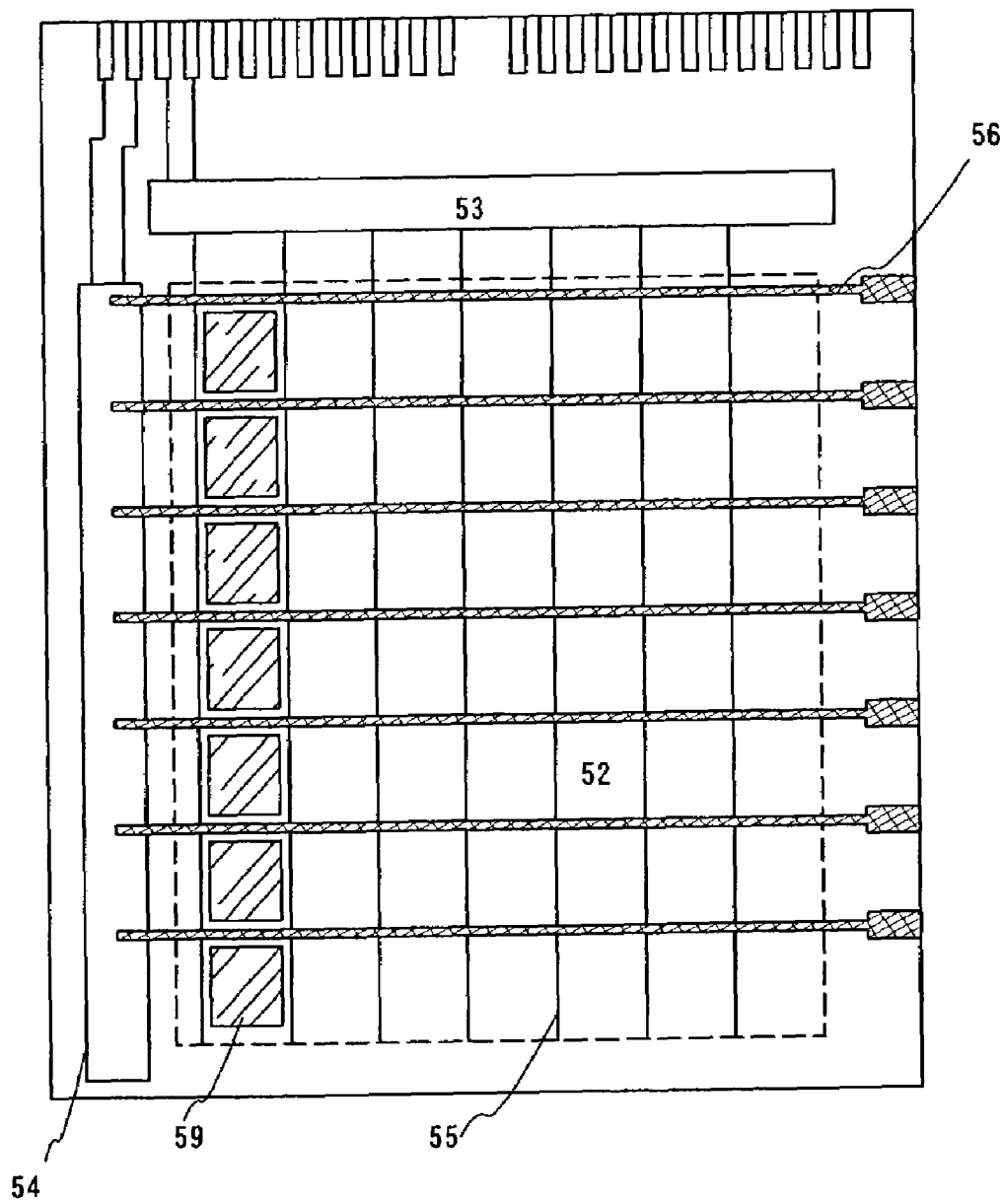
FIG. 13 is a figure showing a top view in a manufacturing process of a liquid-crystal display device (example 2)

This shows an example that the major part of a gate line of a liquid-crystal display device is made by a buried interconnection, in FIGS. 12 and 13.

At first, according to the above embodiment, an etching-stop layer is formed on a substrate having an insulating surface and a silicon-based insulating film is formed covering the etching-stop layer. The insulating film is selectively etched to form an opening (trench) reaching the etching-stop layer. After forming a first barrier layer, electrolytic plating is carried out to form a low-resistance metal film having a sufficient thickness in the opening (trench). Subsequently, planarization represented by the chemical mechanical polishing (hereinafter, referred to as CMP) is made to leave the copper and first barrier layer only in the opening (trench) but remove away unwanted portions, thereby forming an interconnection in a buried form.

Then, a second barrier layer is formed in order to provide an exposed portion of copper with enhanced resistance to oxidation. Furthermore, after forming a layer represented by $AlN_xO_y$, as an underlying insulating film, an underlying insulating film is formed by the layers of a silicon oxide film, a silicon nitride film or a silicon oxide nitride film. Then, a crystalline semiconductor film is patterned to a desired form to form a semiconductor layer, followed by forming a gate insulating film covering the semiconductor layer.

After forming a contact hole reaching the buried interconnection, a gate electrode and a terminal electrode are formed on the gate insulating film. Incidentally, the gate electrode is connected to the buried interconnection to realize the resistance reduction in the gate line. Also, the terminal electrode is provided in plurality at the end of the substrate.

Then, the semiconductor is properly added by a p-type providing impurity element (B or the like) or n-type providing impurity element (P, As or the like), to form source and drain regions. Subsequently, in order to activate the added impurity element, heating process, intense light radiation or laser irradiation is carried out. Then, after an interlayer insulating film is formed and hydrogenation is made, contact holes are formed reaching the source region, the drain region, and the terminal electrode.

Subsequently, source electrodes (lines) 55 or drain electrodes are formed to complete various TFTs. In the stage completing the above process, in the pixel region 52, the drain regions and the respective drain electrodes are electrically connected while source regions and source electrodes (lines) are electrically connected. Meanwhile, in the drive circuit, formed are a source electrode (line) contacted to the source region and a drain electrode contacted to the drain region. Also, in the terminal region, formed are a source line connected to a certain terminal electrode. Then, in the pixel region, the pixel electrodes 59 are arranged in a matrix form that are contacted to the connection electrode contacted to the drain regions. The top view in this process stage is shown in FIG. 13. In FIG. 13, 52 is a pixel region, 53 is a source drive circuit, and 54 shows a region arranging a gate drive circuit. As shown in FIG. 13, the gate line 56 has, at an end, a connection electrode pad provided close to an end of the substrate to flow a current from an external power supply when carrying out electrolytic plating. Incidentally, in this example, the connection electrode pads are provided corresponding to the same number of the gate lines 56. Meanwhile, the gate lines may be formed by connecting the patterns to place all the gate lines in the same potential to carry out a plating process and then cutting them into individual gate lines.

Then, after forming an orientation film 62*a*, a rubbing process is carried out. Then, the substrate and a counter substrate 60 are bonded together by a sealant (not shown), to fill a liquid-crystal material 63 between the substrates, followed by being sealed. The counter substrate 60 is previously provided with a counter electrode 61 of a transparent conductive film and an orientation film 62*b* rubbing-processed. Finally, an FPC (flexible print circuit) for connection to an external circuit is bonded to the terminal electrode. Further, a polarization plate and a color filter are provided.

By the above process, an active-matrix liquid-crystal display device is completed.

Incidentally, concerning the active-matrix liquid-crystal display device having TFTs, three constructions (transparent type, reflection type and semitransparent type) are to be considered. Although there are a transmission type having a pixel electrode made by a transparent conductive film to provide a backlight, a reflection type having a pixel electrode made by a reflection metal film to reflect external light, and a semi-transparent type having a pixel electrode a part of which is made by a transparent conductive film and the other part made by a reflection metal film to properly cause switching, the invention can be applied to any of the structures.

This example can be freely combined with the embodiment.

Example 3

The drive circuit and pixel region formed by carrying out the invention can complete various modules (active-matrix liquid-crystal module, active-matrix EC module). Namely, the invention can complete an electronic apparatus built it in a display part.

Such electronic apparatuses include video cameras, digital cameras, head-mount displays (goggle type displays), car navigators, projectors, car stereo sets, personal computers, and personal digital assistants (mobile computers, cellular phones or electronic books). Examples of them are shown in FIGS. 14A to 14C and 15A and 15B.

Figure 14A:
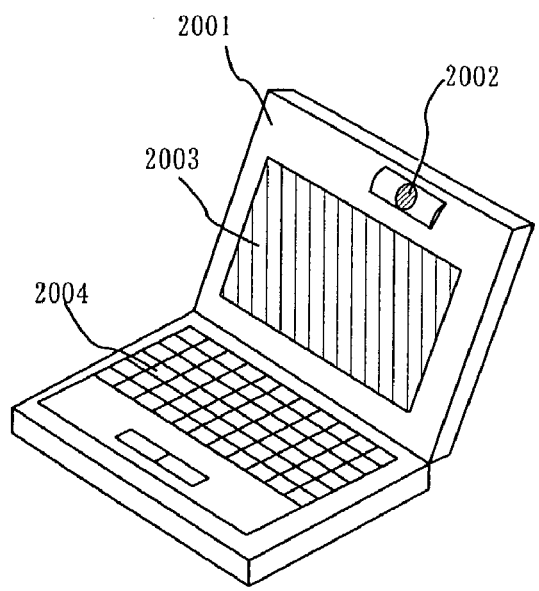
FIGS. 14A to 14C are views showing examples of electronic apparatuses.

FIG. 14A is a personal computer, including a main body 2001, an image input part 2002, a display part 2003, a keyboard 2004 and so on.

Figure 14B:
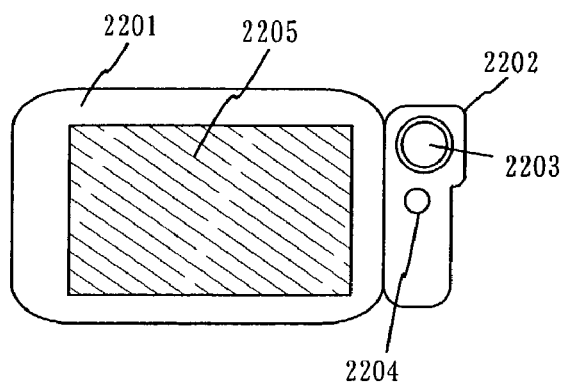

FIG. 14B is a mobile computer, including a main body 2201, a camera part 2202, an image receiving part 2203, an operation switch 2204, and a display part 2205.

Figure 14C:
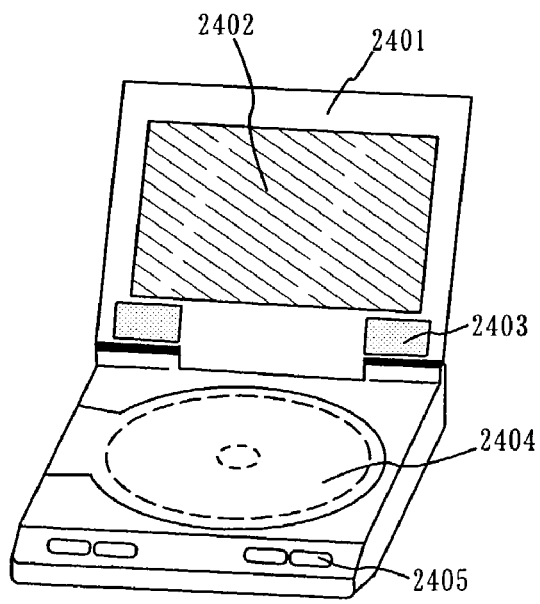

FIG. 14C is a player using a recording medium recording a program (hereinafter, referred to as recording medium), including a main body 2401, a display part 2402, a speaker part 2403, a recording medium 2404, and an operation switch 2405. Incidentally, the player uses, as a recording medium, a DVD (Digital Versatile Disc), a CD or the like, enabling music listening, movie viewing or the Internet.

Figure 15A:
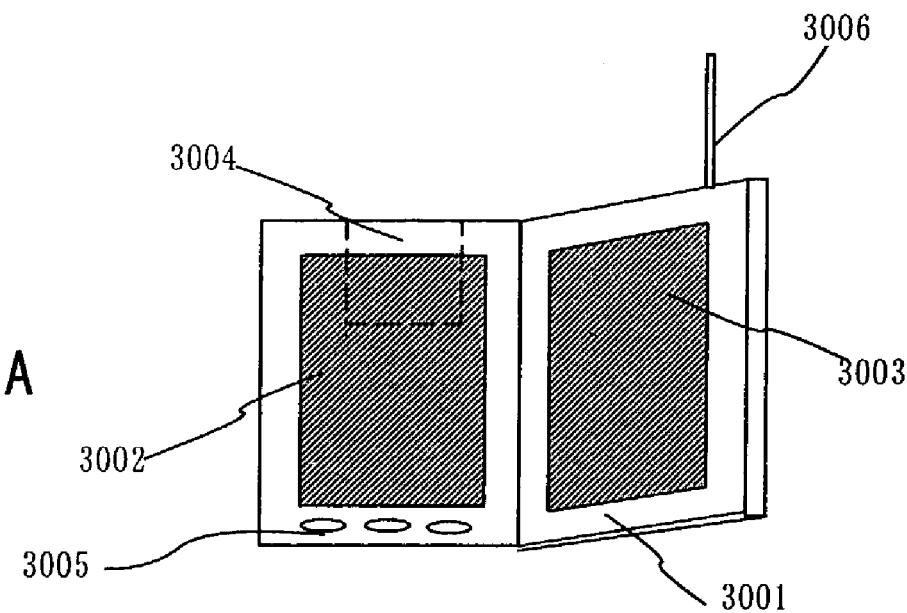
FIGS. 15A and 15B are views showing examples of electronic apparatuses.

FIG. 15A is a portable book (electronic book), including a main body 3001, a display part 3002, 3003, a storage medium 3004, an operation switch 3005, and an antenna 3006.

Figure 15B:
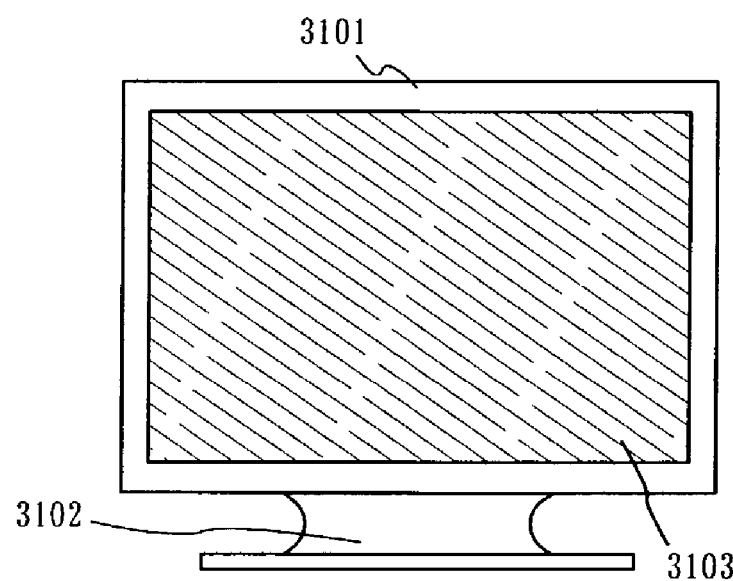

FIG. 15B is a display, including a main body 3101, a support base 3102, and a display part 3103. The invention can complete a display part 3103 having a diagonal length 10–50 inches.

As in the above, the invention has extremely broad application range, and can complete an electronic appliance in every field. Also, the electronic apparatus of this example can be realized by using a structure in any of combinations of the embodiment and examples 1 and 2.

According to the present invention, in a semiconductor device represented by an active-matrix light-emitting display device or liquid-crystal display device, even if the pixel region area increases and the screen size increases, favorable display can be realized. Because the line resistance in the pixel region can be greatly decreased, the present invention can cope with a large screen having a diagonal length of 40 or 50 inches.

What is claimed is:

1. A display device comprising:
   a substrate having an insulating surface;
   a first insulating film formed over the substrate;
   a gate line buried in the first insulating film;
   a second insulating film formed over the first insulating film; and
   a thin film transistor formed over the second insulating film,
   wherein the thin film transistor comprises a semiconductor film having a channel region and source and drain regions, a gate insulating film formed over the semiconductor film, and a gate electrode formed over the gate insulating film,
   wherein the gate line is electrically connected to the gate electrode via a connection electrode through the second insulating film.

2. A display device according to claim 1, wherein the gate line comprises at least one material selected from the group consisting of copper, silver, gold and an alloy thereof.

3. An apparatus having the display device according to claim 1, wherein the electronic apparatus is selected from the group consisting of a video camera, a digital camera, a head-mount display, a car navigator, a projector, a car stereo, a personal computer, a personal digital assistant.

4. A display device comprising:
   a substrate having an insulating surface;
   a first insulating film formed over the substrate;
   a source line buried in the first insulating film;
   a second insulating film formed over the first insulating film; and
   a thin film transistor formed over the second insulating film,
   wherein the thin film transistor comprises a semiconductor film having a channel region and source and drain regions, a gate insulating film formed over the semiconductor film, and a gate electrode formed over the gate insulating film,
   wherein the source line is electrically connected to the source region via a connection electrode through the second insulating film and the gate insulating film.

5. A display device according to claim 4, wherein the source line comprises at least one material selected from the group consisting of copper, silver, gold and an alloy thereof.

6. An electronic apparatus having the display device according to claim 4, wherein the electronic apparatus is selected from the group consisting of a video camera, a digital camera, a head-mount display, a car navigator, a projector, a car stereo, a personal computer, a personal digital assistant.

7. A display device comprising:
   a substrate having an insulating surface;
   a first insulating film formed over the substrate;
   a power supply line buried in the first insulating film;
   a second insulating film formed over the first insulating film; and
   a thin film transistor formed over the second insulating film,
   wherein the thin film transistor comprises a semiconductor film having a channel region and source and drain regions, a gate insulating film formed over the semiconductor film, and a gate electrode formed over the gate insulating film,
   wherein the power supply line is electrically connected to the source region via a connection electrode through the second insulating film and the gate insulating film.

8. A display device according to claim 7, wherein the power supply line comprises at least one material selected from the group consisting of copper, silver, gold and an alloy thereof.

9. An electronic apparatus having the display device according to claim 7, wherein the electronic apparatus is selected from the group consisting of a video camera, a digital camera, a head-mount display, a car navigator, a projector, a car stereo, a personal computer, a personal digital assistant.

10. A display device comprising:
    a substrate having an insulating surface;
    a first insulating film formed over the substrate;
    a gate line buried in the first insulating film;

a second insulating film formed over the first insulating film; and a thin film transistor formed over the second insulating film;

wherein the thin film transistor comprises a semiconductor film having a channel region and source and drain regions, a gate insulating film formed over the semiconductor film, and a gate electrode formed over the gate insulating film, wherein the gate line is electrically connected to the gate electrode via a connection electrode through the second insulating film and the gate insulating film.

11. A display device according to claim 10, wherein the gate line comprises at least one material selected from the group consisting of copper, silver, gold and an alloy thereof.

12. An electronic apparatus having the display device according to claim 10, wherein the electronic apparatus is selected from the group consisting of a video camera, a digital camera, a head-mount display, a car navigator, a projector, a car stereo, a personal computer, a personal digital assistant.

13. A display device comprising:
a substrate having an insulating surface;
a first insulating film formed over the substrate;
a source line buried in the first insulating film;
a second insulating film formed over the first insulating film;
a thin film transistor formed over the second insulating film; and
a third insulating film formed over the thin film transistor,
wherein the thin film transistor comprises a semiconductor film having a channel region and source and drain regions, a gate insulating film formed over the semiconductor film, and a gate electrode formed over the gate insulating film,
wherein the source line is electrically connected to the source region via a connection electrode through the second insulating film and the third insulating film.

14. A display device according to claim 13, wherein the gate line comprises at least one material selected from the group consisting of copper, silver, gold and an alloy thereof.

15. An electronic apparatus having the display device according to claim 13, wherein the electronic apparatus is selected from the group consisting of a video camera, a digital camera, a head-mount display, a car navigator, a projector, a car stereo, a personal computer, a personal digital assistant.

* * * * *